United States Patent [19]
Nishimura et al.

[11] Patent Number: 5,633,821
[45] Date of Patent: May 27, 1997

[54] NONVOLATILE MEMORY DEVICE

[75] Inventors: Kiyoshi Nishimura; Hideki Hayashi; Jun Muramoto; Takaaki Fuchikami; Hiromi Uenoyama, all of Kyoto, Japan

[73] Assignee: Rohm Co., Ltd., Japan

[21] Appl. No.: 374,221

[22] Filed: Jan. 18, 1995

[30] Foreign Application Priority Data

Jan. 18, 1994 [JP] Japan ................................ 6-003796
Dec. 22, 1994 [JP] Japan ................................ 6-319930

[51] Int. Cl.$^6$ .................................................. H01L 29/78
[52] U.S. Cl. .................. 365/145; 365/117; 365/189.09; 365/184
[58] Field of Search ................................ 365/145, 185, 365/117, 189.09, 295, 184

[56] References Cited

U.S. PATENT DOCUMENTS

| | | |
|---|---|---|
| 4,873,664 | 10/1989 | Eaton, Jr. . |
| 4,888,630 | 12/1989 | Paterson ............................ 365/145 |
| 4,888,733 | 12/1989 | Mobley . |
| 5,198,994 | 3/1993 | Natori ................................ 365/145 |

FOREIGN PATENT DOCUMENTS 5-129625  5/1993  Japan .

*Primary Examiner*—Viet Q. Nguyen
*Attorney, Agent, or Firm*—Merchant, Gould, Smith, Edell, Welter & Schmidt

[57] ABSTRACT

A nonvolatile memory with a simple structure where recorded information can be read without destruction. A voltage is impressed between a control gate and a memory gate for writing. A ferroelectric layer is polarized in accordance with the direction of the impressed voltage. A control gate voltage to make channel is small when the ferroelectric layer is polarized with the control gate side being positive. Control gate voltage to make channel is large when the ferroelectric layer is polarized with the control gate side being negative. The reference voltage is impressed on the control gate for reading. A large drain current flows when the ferroelectric layer is polarized with a second polarization and a small drain current flows when the ferroelectric layer is polarized with a first polarization. Record information can be read by detecting the drain current. Polarization status of the ferroelectric is not destroyed in the reading operation.

19 Claims, 14 Drawing Sheets

FIG. 6

APPLIED VOLTAGES WHEN MEMORY DEVICE M22 IS SELECTED

| STANDBY MODE | | WRITE MODE | |
|---|---|---|---|
| CGL1: open | SL1: MGL1:$V_{ref2}$ open MGL2:$V_{ref2}$ MGL3:$V_{ref2}$ | CGL1: open | SL1: MGL1:$V_{ref2}$ open MGL2:$V_{DD}$/GND MGL3:$V_{ref2}$ |
| CGL2: open | SL2: MGL1:$V_{ref2}$ open MGL2:$V_{ref2}$ MGL3:$V_{ref2}$ | CGL2: $V_{TH}$ | SL2: MGL1:$V_{ref2}$ GND MGL2:$V_{DD}$/GND MGL3:$V_{ref2}$ |
| CGL3: open | SL3: MGL1:$V_{ref2}$ open MGL2:$V_{ref2}$ MGL3:$V_{ref2}$ | CGL3: open | SL3: MGL1:$V_{ref2}$ open MGL2:$V_{DD}$/GND MGL3:$V_{ref2}$ |

| READ MODE | | POSSIBLE DRAIN CURRENT (DRAIN CURRENT CAPACITY) | |
|---|---|---|---|
| CGL1: open | SL1: MGL1:$V_{ref2}$ open MGL2:open MGL3:$V_{ref2}$ | I=0 I=0 I=0 | (M11) (M21) (M31) |
| CGL2: $V_{TH}$ | SL2: MGL1:$V_{ref2}$ GND MGL2:open MGL3:$V_{ref2}$ | I=I0 I=I0max OR 0 I=I0 | (M12) (M22) (M32) |
| CGL3: open | SL3: MGL1:$V_{ref2}$ open MGL2:open MGL3:$V_{ref2}$ | I=0 I=0 I=0 | (M13) (M23) (M33) |

F I G. 7
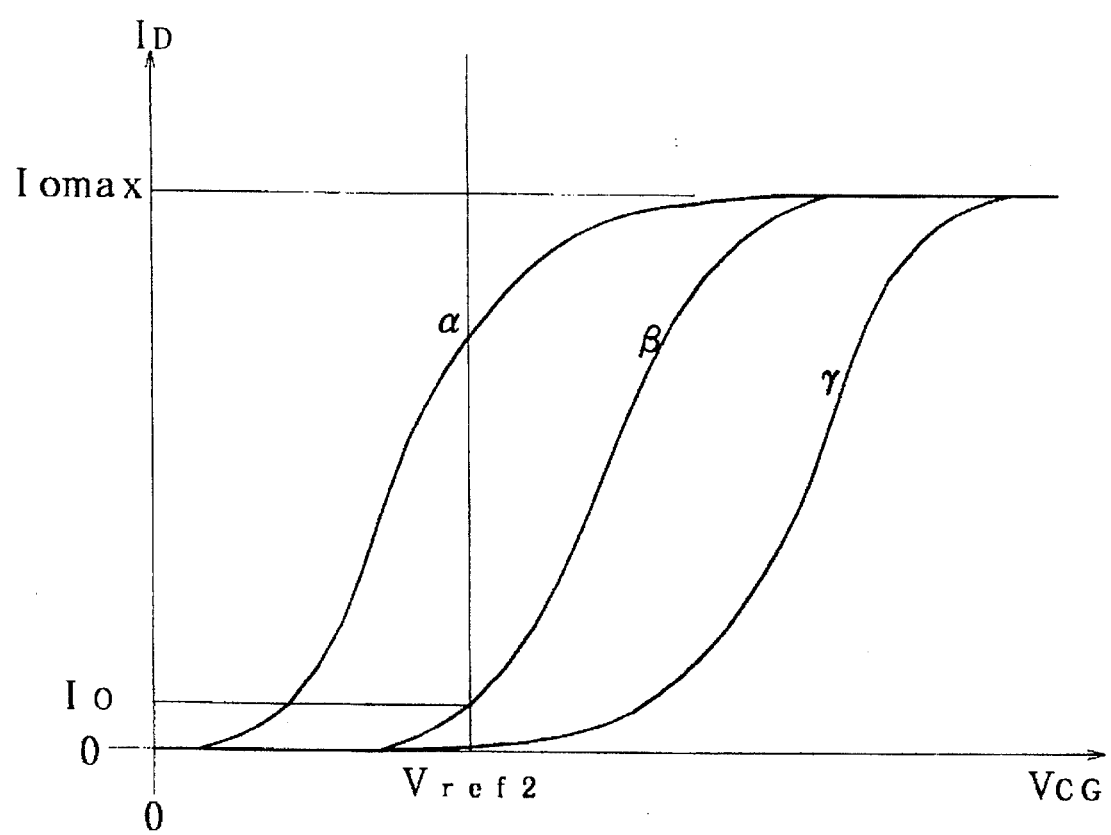

GENERATING CIRCUIT FOR
REFERENCE VOLTAGE

FIG. 14

| | WRITE | READ | STANDBY |
|---|---|---|---|
| R/W | L | H | — |
| IN | HorL | — | — |
| OUT | — | HorL | — |
| $C_1$ | L | L | L |
| $C_2$ | H | H | L |
| $L_1$ | L | L | L |
| $L_2$ | H | H | L |

NONVOLATILE MEMORY DEVICE

BACKGROUND OF THE INVENTION

1. Field of the Invention

The present invention relates to nonvolatile memory device.

2. Description of the Prior Art

Recently, a nonvolatile memory device using ferroelectric is getting attention in the industry, and several structures of the device and circuit configurations for the device are proposed. FIG. 1 shows a structure of a nonvolatile memory cell which is disclosed in U.S. Pat. No. 4,888,733. In the figure, a transistor 18 and a transistor 20 are connected to both sides of a ferroelectric capacitor 2. Gates of the transistor 18 and the transistor 20 are connected with a word line 8. Also, a source of the transistor 18 is connected to a bit line 14, and a source of the transistor 20 is connected with a bit line 16.

The ferroelectric capacitor 2 is polarized when a certain voltage is applied between the bit line 14 and the bit line 16 after turning on the transistor 18 and the transistor 20. Polarization of the ferroelectric capacitor 2 is maintained even after suspending applying the voltage. Direction of the polarization can be turned over by applying a voltage in the opposite direction. Accordingly, the ferroelectric capacitor 2 is able to store data under nonvolatile conditions.

When reading out the stored data from the capacitor, a certain voltage is applied to the 5 ferroelectric capacitor 2. Upon applying the voltage to the ferroelectric capacitor 2, memorized polarization can be known by detecting whether the polarization turns over or not. In other words, memorized polarization can be known by detecting a current which flows by turning over 10 the polarization. Since the memorized polarization is changed (i.e. stored data is erased) when reading out the data from the ferroelectric capacitor 2, the same data (as the stored data) is written into the ferroelectric capacitor immediately after reading to maintain the polarization direction.

Furthermore, another nonvolatile memory device utilizing ferroelectric capacitors consisting of 2 ferroelectric capacitors and 2 transistors is proposed (disclosed in U.S. Pat. No. 4,873,664).

However, the above mentioned nonvolatile memory devices have the following issues to resolve.

First, the memory device disclosed in U.S. Pat. No. 4,888,733 requires 2 transistors besides the ferroelectric capacitor for each cell. Therefore, structure of the memory device is complicated. In the meantime, the memory device disclosed in U.S. Pat. No. 4,873,664 requires 2 transistors and 2 ferroelectric capacitors for each cell, so that construction of the device is too complex.

Further, since the stored data in the ferroelectric capacitor is erased when reading out the data as described above, the same data (as the stored data) must be re-written into the capacitor, so that control of the read operation is so complex.

SUMMARY OF THE INVENTION

It is an object of the present invention to provide an nonvolatile memory device which can read out stored data under nondestructive conditions with simple structure.

A nonvolatile memory device in accordance with present invention comprises:

a) a source region of a first conductive type and drain region of a first conductive type, b) a channel region of a second conductive type formed between the source and the drain region, c) a memory gate formed on the channel region and insulated from the channel region, d) a ferroelectric layer formed on the memory gate, and e) a control gate formed on the ferroelectric layer.

While the novel features of the invention are set forth in a general fashion, both as to organization and content, they will be better understood and appreciated, along with other objections and features thereof, from the following detailed description taken in conjunction with the drawings.

BRIEF DESCRIPTION OF THE DRAWINGS

FIG. 6 is a view showing a table of applied voltages for each operation mode in the circuit shown in FIG. 5.

FIG. 7 is a view showing a graph illustrating a reference voltage Vref2 used for other embodiment.

FIG. 14 is a view illustrating a table of applied voltages for each mode of the circuit shown in FIG. 11.

DETAILED DESCRIPTION OF THE PREFERRED EMBODIMENTS

Figure 3:
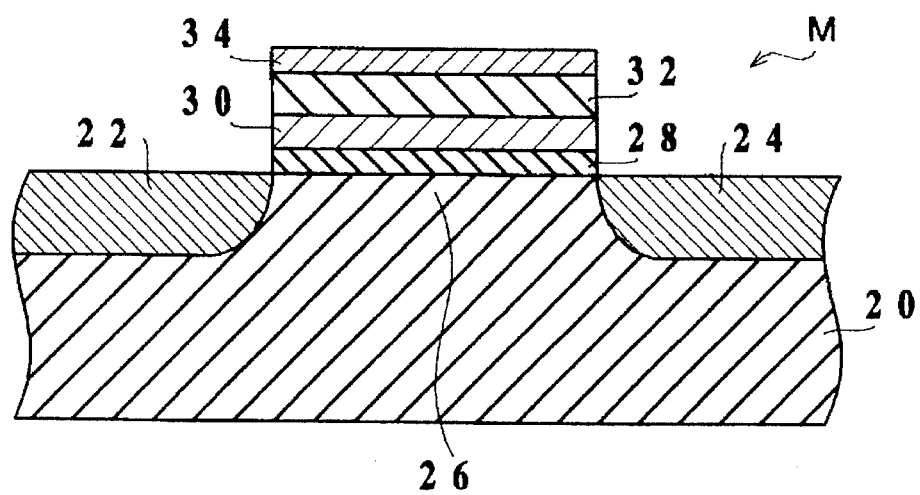
FIG. 3 is a view illustrating a structure of a nonvolatile memory device M in an example of the present invention.

FIG. 3 shows a structure of an nonvolatile memory device M as an embodiment in the present invention. In the device M, a source region 22 and a drain region 24 are formed, in a silicon substrate 20. An insulation layer 28 made of silicon oxide (SiO2) or silicon nitride (SIN), etc., is formed on a channel region 26 in the silicon substrate 20. A lower conducting layer (memory gate) 30 made of platinum or the like is formed on the insulation layer 28. A ferroelectric layer 32 made of $PbZr_xTi_{1-x}O_3$(PZT), etc., is formed on the lower conducting layer 30 and an upper conducting layer (control gate) 34 made of platinum or the like is formed on the layer 32. The lower conducting layer 30 or the upper conducting layer 34 may be oxided conducting material such as RuOx, IrOx, ITO or metal material such as Pb, Au, Ag, Al, and Ni, instead of the platinum as described above.

Figure 4:
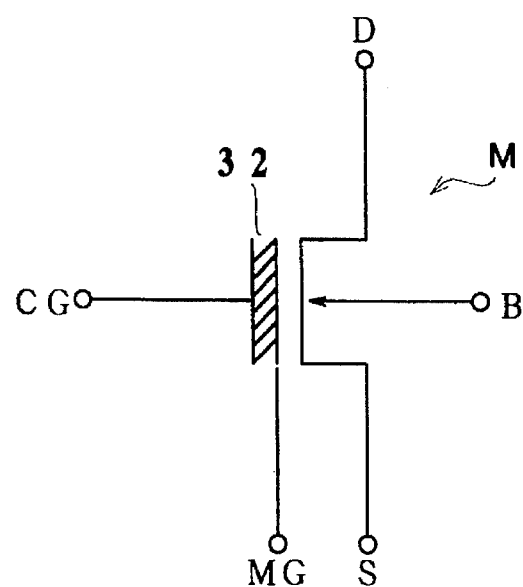
FIG. 4 is a view illustrating the nonvolatile memory device shown in FIG. 3 as a symbol.

FIG. 4 shows a symbol of the nonvolatile memory device M shown in FIG. 3. A control gate electrode CG is connected to the upper conducting layer 34 and a memory gate electrode MG is connected to the lower conducting layer 30. Also, a source electrode S is connected to the source region 22 and a drain electrode D is connected to the drain region 24.

A certain voltage is applied between the control electrode CG and the memory gate MG when data is stored into the nonvolatile memory device M. Consequently, the ferroelectric 32 of the memory device M is polarized and the polarization is maintained even though application of the voltage is suspended. Namely, it is possible to obtain two opposite polarization states according to polarity of the applied voltage. For example, when a voltage which is low compared with a voltage applied to the control gate CG, is applied to the memory gate electrode, the ferroelectric layer 32 is polarized as the control gate side is of negative polarity (defined as first polarization state). On the other hand, when a voltage which is high compared with a voltage applied to the control gate CG, is applied to the memory gate electrode, the ferroelectric layer 32 is polarized as the control gate side is of positive polarity (defined as second polarization state). Thus, two states can be memorized in the memory device M having the ferroelectric layer 32 with nonvolatile condition. In other words, information (data) corresponding to the two states can be memorized in the memory device M.

When the ferroelectric layer 32 is polarized as the control gate side is positive polarity (second polarization state), necessary applied voltage of control gate CG to form a channel in the channel region is low. On the other hand, when the ferroelectric layer 32 is polarized as the control gate side is negative polarity (first polarization state), necessary applied voltage of control gate CG to form a channel in the channel region is high. Therefore, it is possible to read out the stored information (data) by detecting whether the channel is formed or not in the channel region 26 by means of applying an intermediate voltage between the necessary voltage of control gate in the first polarization state and that in second polarization state.

Figure 1:
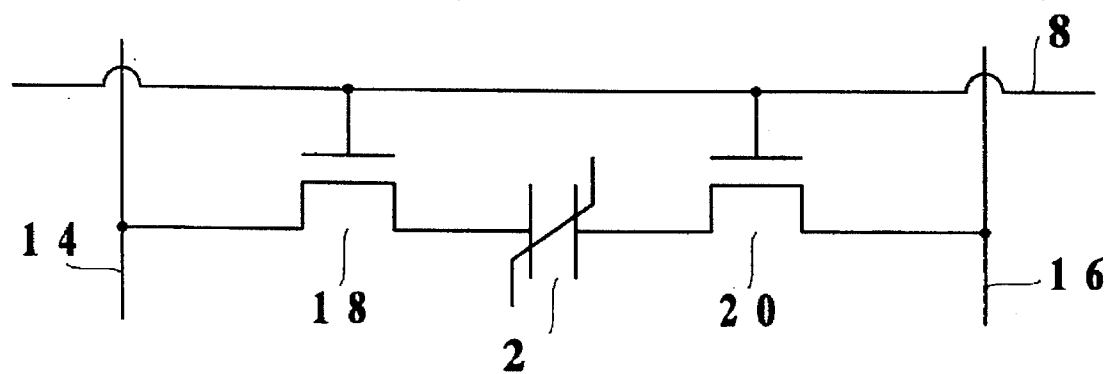
FIG. 1 is a view illustrating a nonvolatile memory device in the prior art.
Figure 2A:
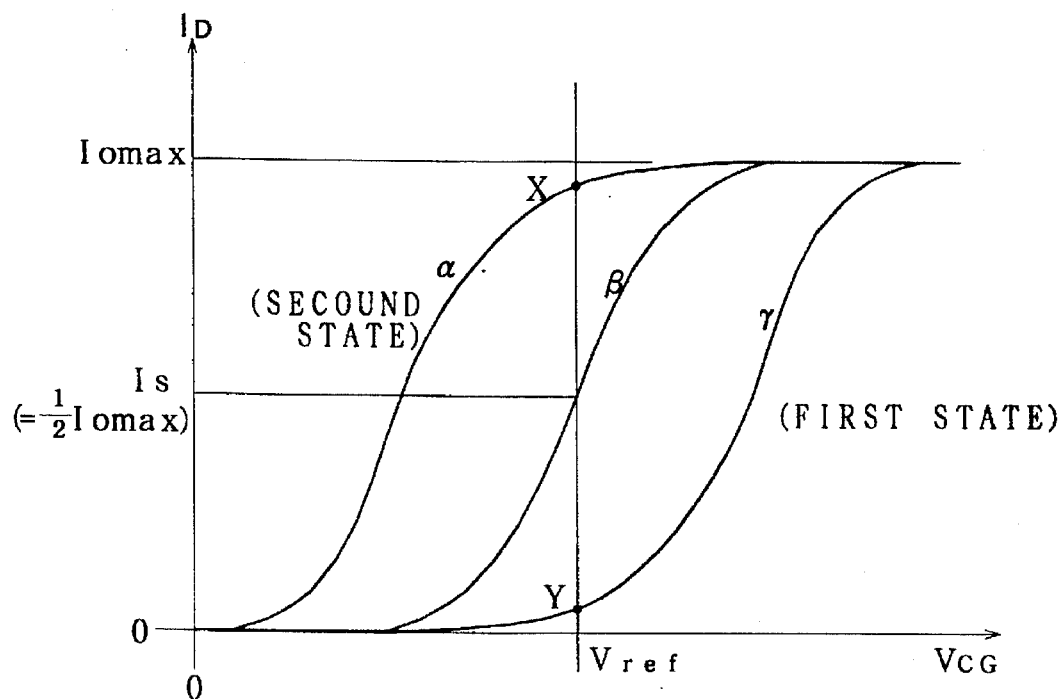
FIG. 2A is a view illustrating the electrical characteristics of an nonvolatile memory device M in an example of the present invention.
Figure 2B:
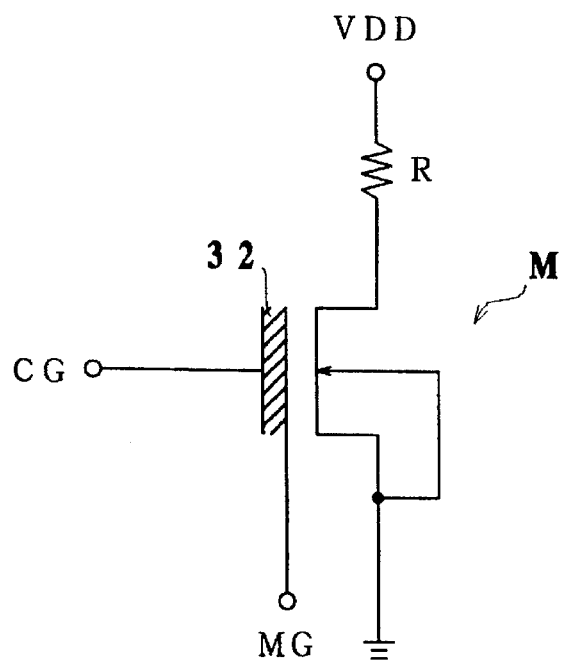
FIG. 2B is a diagram illustrating a circuit which measures the electrical characteristics shown in FIG. 1A.

The relationship between the first and the second polarization state will be explained referring to FIG. 2A which shows an electric characteristics of the memory device M measured by a circuit shown in FIG. 2B. In FIG. 2A, a curve β shows a characteristic between a control gate voltage $V_{CG}$ and a drain current $I_D$ when the control gate electrode CG and the memory gate electrode MG are electrically connected (short-circuited). The drain current $I_D$ increases when the control gate voltage $V_{CG}$ increases. When the control gate voltage $V_{CG}$ further increases, the drain current $I_D$ reaches an established maximum drain current $I_{OMAX}$ determined by the value of a resistance R.

Curve α shows an electric characteristic that the ferroelectric is polarized as the control gate CG is the positive polarity (under the second state). Although, the curve α shows a similar characteristic to the curve β, the drain current starts to flow from a low control gate voltage $V_{CG}$ by an influence of polarization of the ferroelectric layer 32. Also, the drain current reaches an established maximum drain current $I_{OMAX}$ at a low control voltage $V_{CG}$.

Curve γ shows a characteristic that the ferroelectric is polarized as the control gate CG is the negative polarity (under the first state). The curve γ shows similar characteristics to the curve β, but the drain current starts to flow at a higher control gate voltage $V_{CG}$ because of the influence of polarization of the ferroelectric layer 32. Also, the drain current reaches an established maximum drain current $I_{OMAX}$ at an high control voltage $V_{CG}$.

When read out from the device M, a control gate voltage corresponding to a drain current (hereinafter referred to as reference current) $I_S$, which is half of the value of the established maximum drain current $I_{OMAX}$, is applied to the control gate CG as a reference voltage $V_{ref}$. The stored information can be known by judging whether the drain current $I_D$ is higher (see point X in FIG. 2A) than the reference current $I_S$ or not (:see point Y in FIG. 2A).

Figure 5:
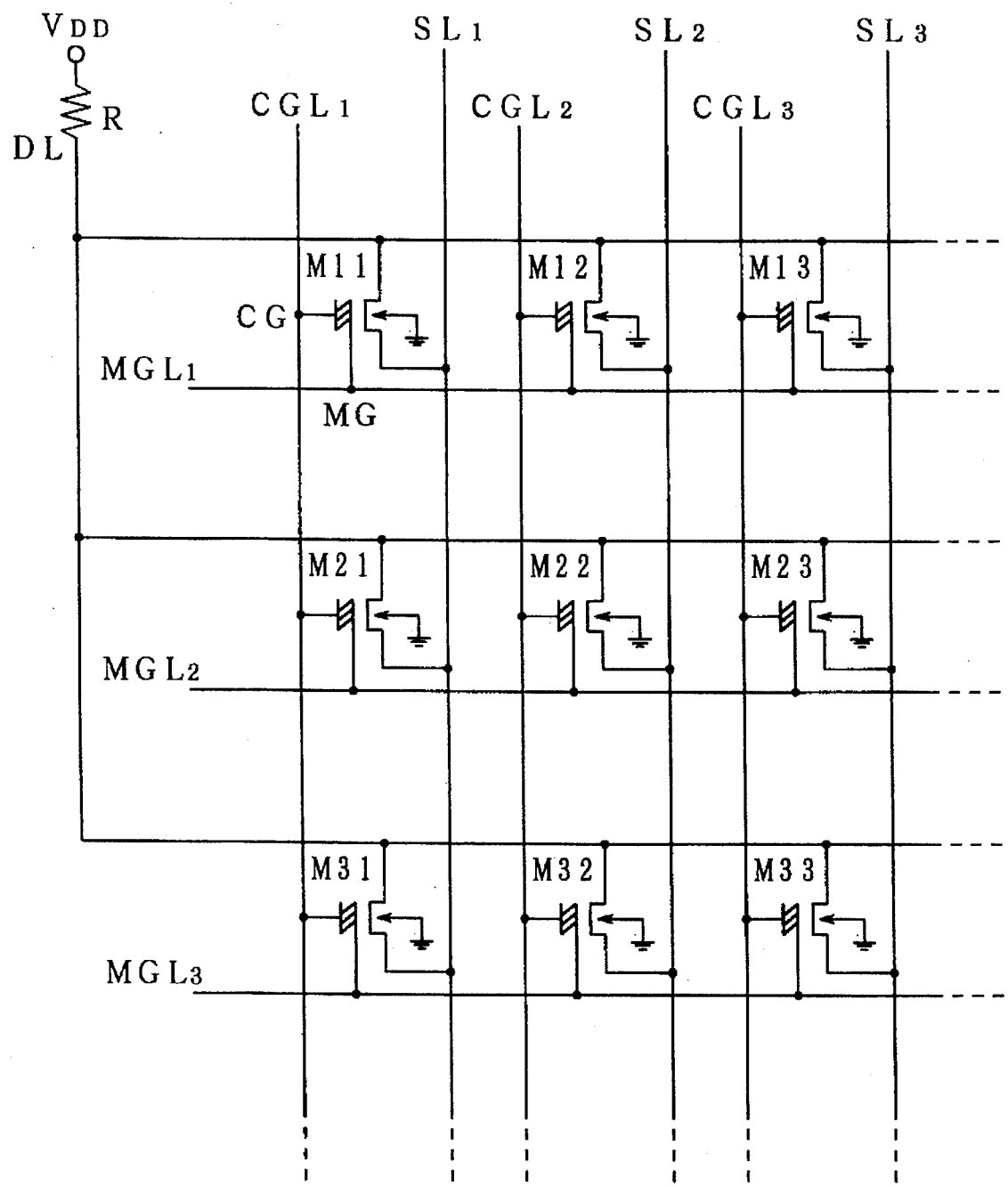
FIG. 5 is a view illustrating a diagram of a nonvolatile memory utilizing the nonvolatile memory device M shown in FIG. 4.

FIG. 5 shows non-volatile memory in which the non-volatile memory devices of FIG. 4 are connected in a matrix. Each drain electrode D of the memory devices (for example, $M_{11}$, $M_{12}$, $M_{13}$. . . ) of same line in each column are connected to a drain line $DL_1$, $DL_2$, $DL_3$. . . , respectively. The drain lines $DL_1$, $DL_2$, $DL_3$. . . are gathered with a unified drain line DL which is connected to source voltage $V_{DD}$ through a resistor R.

Each control gate electrode CG of the memory devices (for example, $M_{11}$, $M_{21}$, $M_{31}$. . . ) of same column in each line are connected to a control gate line $CGL_1$, $CGL_2$, $CGL_3$. . . , respectively. Each source electrode S of the memory devices (for example, $M_{12}$, $M_{22}$, $M_{32}$. . . of same column in each line are connected to a source line $SL_1$, $SL_2$, $SL_3$. . . , respectively. Further, each memory gate electrode MG of the memory devices (for example, $M_{11}$, $M_{12}$, $M_{13}$. . . ) of same line in each column are connected to a memory gate line $MGL_1$, $MGL_2$ $MGL_3$. . . , respectively.

Referring to FIG. 6 which shows the applied voltage to each line in a write, read or standby operation mode, the write to or read from selected memory device $M_{22}$ or standby mode will be described.

In the write operation mode, the control gate line $CGL_2$ which is connected to the selected memory device $M_{22}$, is applied with the reference voltage $V_{ref}$ and the other control gate lines $CGL_1$, $CGL_3$. . . are in a floating status. The source line $SL_2$ is grounded, and the other source lines $SL_1$, $SL_3$. . . are in a floating status. The memory gate line $MGL_2$ is applied with writing voltage (5 V or ground) corresponding to information to be recorded, and the other memory gate lines $MGL_1$, $MGL_3$. . . are applied with the reference voltage $V_{ref}$. By applying such voltages only to the ferroelectric film 32 of the selected memory device $M_{22}$, writing voltage is applied and the ferroelectric film 32 is polarized. In other words, the ferroelectric film 32 of the selected memory device $M_{22}$ is polarized into a first state or a second state in accordance with the writing voltage.

In the read operation mode, the control gate line $CGL_2$ which is connected to the selected memory device $M_{22}$, is applied with reference voltage $V_{ref}$ and the other control gate lines $CGL_1$, $CGL_3$. . . are in a floating status. The source line $SL_2$ is grounded, and the other source lines $SL_1$, $SL_3$. . . are in a floating status. The memory gate line $MGL_2$ is in a floating status, and the other memory gate lines $MGL_1$, $MGL_3$. . . are applied with the reference voltage $V_{ref}$.

Only to the control gate line $CGL_2$, the reference voltage $V_{ref}$ is applied. Therefore, in the unselected memory devices $M_{11}$, $M_{21}$, $M_{31}$, $M_{13}$, $M_{23}$, $M_{33}$. . . connected to the other control gate lines $CGL_1$, $CGL_2$, ..., the drain current does not flow. In the selected memory device $M_{22}$, the control gate is applied with the reference voltage $V_{ref}$ and the memory gate is in a floating status. Therefore, the value of the drain current $I_D$ becomes zero (see point Y of FIG. 2A) or maximum $I_{OMAX}$ (see point X of FIG. 2A) in accordance with recorded information in the selected memory device $M_{22}$ (in accordance with polarization direction of the memory device $M_{22}$) By judging whether the drain current $I_D$ is larger or less than the reference current $I_S$, the recorded information can be read. In the read operation, the recorded information (the direction of polarization) can be maintained and is not destroyed.

In such a read operation, because in the unselected memory devices $M_{12}$, $M_{32}$ the reference voltage $V_{ref}$ is applied both to the control gate and memory gate, the control and memory gates are in the same state as connected each other. Therefore, unexpected drain current corresponds to the reference voltage $V_{ref}$ on the curve β of FIG. 2A in the unselected memory devices $M_{12}$, $M_{32}$. When this unexpected drain current is so large, erroneous read operation is carried out. When the memory device has the characteristic shown in FIG. 2A, each unexpected drain current of the unselected memory devices $M_{12}$, $M_{32}$ becomes $I_{OMAX}/2$ and the unexpected drain currents cause the erroneous operation.

To prevent such erroneous operation, suppressed reference voltage $V_{ref2}$ is used, as shown in FIG. 7 in this embodiment. The suppressed reference voltage $V_{ref2}$ corresponds to suppressed reference current $I_O$ that is considerably smaller than the reference current $I_S$. By using the suppressed reference voltage $V_{ref2}$ the drain current of the unselected memory devices $M_{12}$, $M_{32}$ becomes extremely small relative to $I_O$. Therefore, gathered drain current flowing in the unified drain line DL is approximately $I_{OMAX}$ or zero according to the polarization direction of selected memory device $M_{22}$, and correct read operation can be carried out. Also in this embodiment, recorded information of the selected memory device $M_{22}$ is read out by judging whether the gathered drain current ID is larger ($I_{OXX}$) or less ($I_{OYY}$) than the reference current $I_S$ (=$I_{OMAX}/2$), as shown in FIG. 2A. The value of suppressed reference current $I_O$ is preferably much smaller than $I_{OMAX}/2K$ when K is a number of memory device in a column.

For enabling large $I_O$ by reducing the K, the drain lines may be grouped in desired two or more blocks, and two or more unified drain lines may be provided for each block.

As described above, use of the suppressed reference voltage $V_{ref2}$ prevents erroneous read operation. In the case of using the suppressed reference voltage $V_{ref2}$ also in the write operation, the suppressed reference voltage $V_{ref2}$ may be enough voltage for dielectric polarization of ferroelectric layer 32. In this embodiment, the suppressed reference voltage $V_{ref2}$ is approximately 1 V when $V_{DD}$ is 5 V.

As described above, the write and read operations can be carried out to the desired memory device.

In the above-mentioned embodiment, the impressed voltage (reference voltage $V_{ref2}$) to the memory gate MG for writing is of the same value as the impressed voltage (reference voltage $V_{ref2}$) to the memory gate MG for reading. Therefore, the voltage generation circuit becomes simplified. In other embodiments, the impressed voltage for writing may be of a different value from the impressed voltage for reading, but should be of intermediate voltage corresponding to a current value between established maximum drain current and zero.

A generation circuit for reference voltage V.f or $V_{ref2}$ is necessary to operate the memory circuit of FIG. 5. As is clear by FIGS. 2 and 7, a suitable reference voltage or $V_{ref2}$ corresponding to the characteristic of the memory device is necessary to prevent erroneous operation. In this embodiment, a generation circuit 40 for reference voltage as shown in FIG. 8 is used for obtaining a suitable reference voltage $V_{ref2}$.

Figure 8:
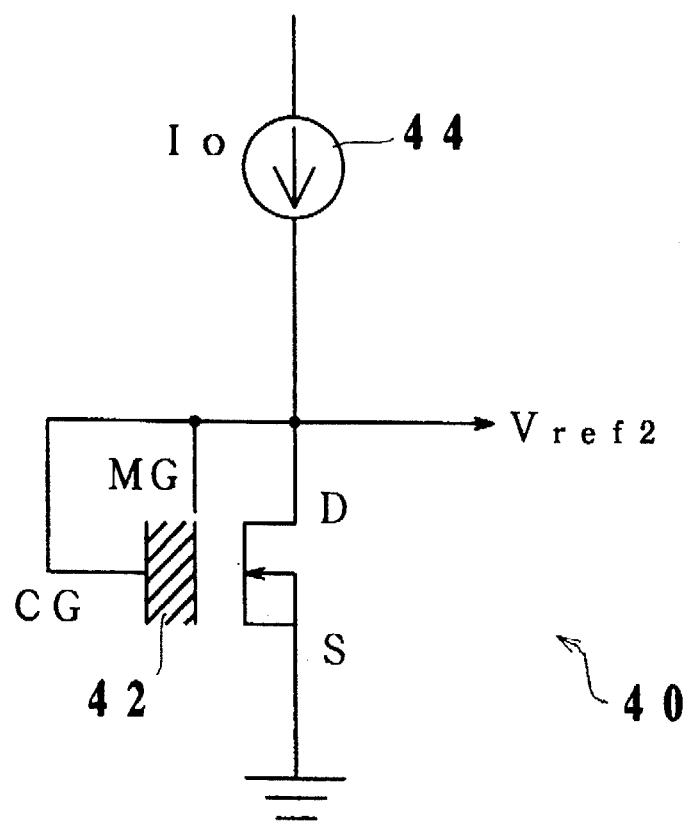
FIG. 8 is a view illustrating a diagram of a reference voltage generating circuit 40.

In FIG. 8, a device 42 for generating the reference voltage is the same device as the memory device M needs for the reference voltage. The device 42 is made from the same wafer, in the same process and at the same time as the memory device M. In the reference voltage generating circuit 40, the control gate electrode CG, the memory gate electrode MG and the drain electrode D of the device for generating the reference voltage 42 are connected, and a constant current supply 44 for supplying the suppressed reference current Io (see FIG. 7) is connected to the drain D. Electric characteristics of the device 42 can be described as the curve β in FIG. 7, since the control gate electrode CG and the memory gate electrode MG of the device 42 are short-circuited. Also, the current Io is given to the drain D of the device 42, the voltage at the control gate electrode CG is the reference voltage $V_{ref2}$. As mentioned above, the device 42 is made from the same wafer, in same process and the at same time with the memory device M. Therefore, when electric characteristics of the memory device M are shifted in the process of production or operation, the electric characteristics of the device 42 follow to the characteristics of memory device M, so that the reference voltage $V_{ref2}$ can be maintained at the appropriate value relative to the electric characteristics of the memory device M.

When the reference voltage $V_{ref1}$ is required instead of $V_{ref2}$, the current source 44 which supplies reference current $I_S$, is used. Similar to the above, when an intermediate voltage is required, the current source 44 which supplies current correspond to the intermediate voltage is used.

Meantime, to operate the circuit shown in FIG. 5, a circuit for detecting drain current is required. In the explanation of the FIG. 5 described above, stored data of the memory device $M_{22}$ (hereinafter referred to as a selected device) is detected by judging whether the drain current flows of the drain line DL is higher or lower than the reference current Is. Power supply voltage $V_{DD}$ is applied to the drain line DL through the resistor R so that the flow of the drain current lower than the reference current Is at the selected device is polarized under the first state, and the flow of the drain current higher than the reference current Is at the selected device is polarized under the second state. It is possible to carry out the detection by measuring the current flowing in the drain lines DL. However, it causes complexity in the circuit.

Figure 9:
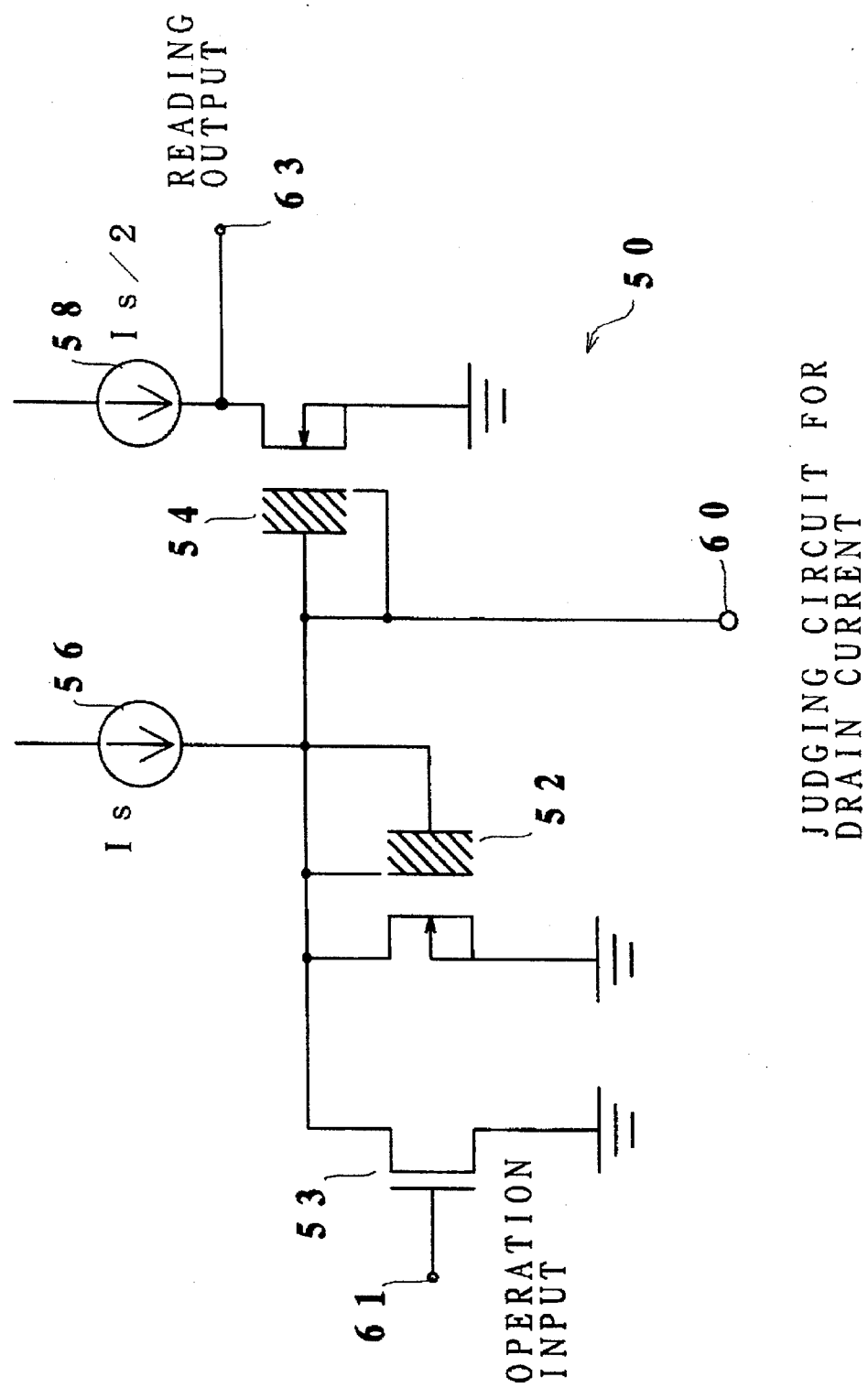
FIG. 9 is a view illustrating a diagram of a drain current detection circuit 50.

To simplify the circuit and carrying out accurate detection, a judgment circuit 50 for the drain current shown in FIG. 9 may be used. When the judgment circuit 50 is used for the circuit shown in FIG. 5, the resistance R is not used. First device 52 for current judgment and second device 54 for current judgment are made from the same wafer, in the same process and at the same time with the memory device M. A constant-current source 56 supplies a current Is that is half the value of the established maximum drain current $I_{OMAX}$, and is connected to drain electrode D of the device 52. Also, a constant current source 58 supplies a current that is half the value of the current Is, and is connected to drain electrode D of the device 54. A terminal 60 of the circuit 50 is connected to the drain line DL of FIG. 5.

When the selected memory device $M_{22}$ is polarized under the second polarization state and has a capability to flow drain current over the current Is, the current Is of the constant-current source 56 flows to the memory device M$_{22}$ and does not flow into the device 52. Thus, both the device 52 and the device 54 are turned to an off state. On the contrary, when the selected memory device M$_{22}$ is polarized under the first polarization state and does not have a capability to flow a drain current over the current Is, most of the current Is of the constant-current source 56 does not flow to the memory device M$_{22}$ and flows into the device 52. Thus, both the device 52 and the device 54 are turned to an on state. Therefore, an output corresponding to stored data in the selected memory device M$_{22}$ can be obtained from a read-out output terminal 63. Since both the (device 52 and the device 58 are made from the same wafer, in the same process and at the same time with the memory device M as the device 42, the probability of error becomes small.

When an input at an operating input terminal 61 is "L", the judgment circuit 50 is operated as described above because the transistor 53 is turned off. However, when the input at the operating input terminal 61 is "H", the read-out output terminal 63 is fixed to the "L" state. This is because the transistor 53 is turned 5 on by the input and current from the constant-current source 56 flows through the transistor The constant-current source shown in FIG. 8 and FIG. 9 can be realized under a circuit shown in FIG. 10. In the circuit, a device 62 for generating current is made on the same wafer, in the same process and at the same time as the memory device M. The memory gate electrode MG and the control gate electrode CG of the device 62 are connected and the power Supply V$_{DD}$ is connected to them. Also, an input side of a current mirror circuit 55 is connected to drain electrode D of the device 62. Thus, the established maximum drain current I$_{OMAX}$ corresponds with shape and capability of the device flows to the drain D of the device 62. Also, a resistor Ra is connected to an output side 55$a$ of the current mirror circuit 55. By selecting a value of resistor Ra, it is possible to obtain the reference current Is (as half the value of the I$_{OMAX}$).

In the same manner as above, a resistor Rb to obtain half the value of the current Is (as quarter a value of the I$_{OMAX}$) is connected to an output side 55$b$. Further, a resistor Rc to obtain suppressed reference current Io (see FIG. 7 is connected to an output side 55$c$.

Although a desired output current is obtained by selecting the value of the resistor in the embodiment described above, it is possible to obtain the desired output current by adjusting the width of a transistor (transistor width) of the output side. Consequently, it is possible to obtain the current by selecting both factors.

Figure 10:
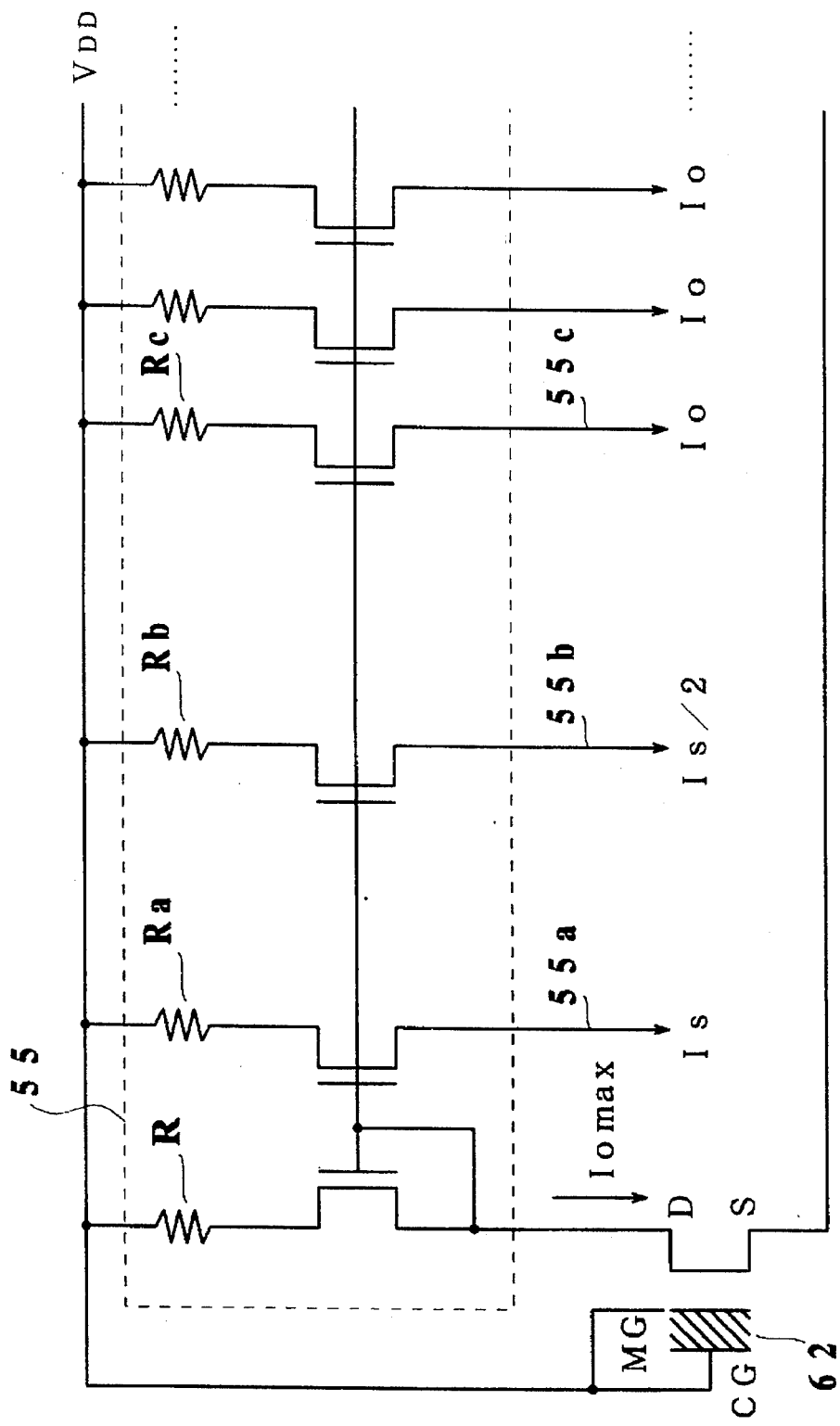
FIG. 10 is a view illustrating a diagram of a constant current power supply.

In the circuit shown in FIG. 10, the device 62 is made from the same wafer, in the same process and at the same time with the memory device M, and is used to obtain the established maximum drain current I$_{OMAX}$ which is used to generate various output currents. Thus, a change in electric characteristics which causes errors can be canceled.

Figure 11:
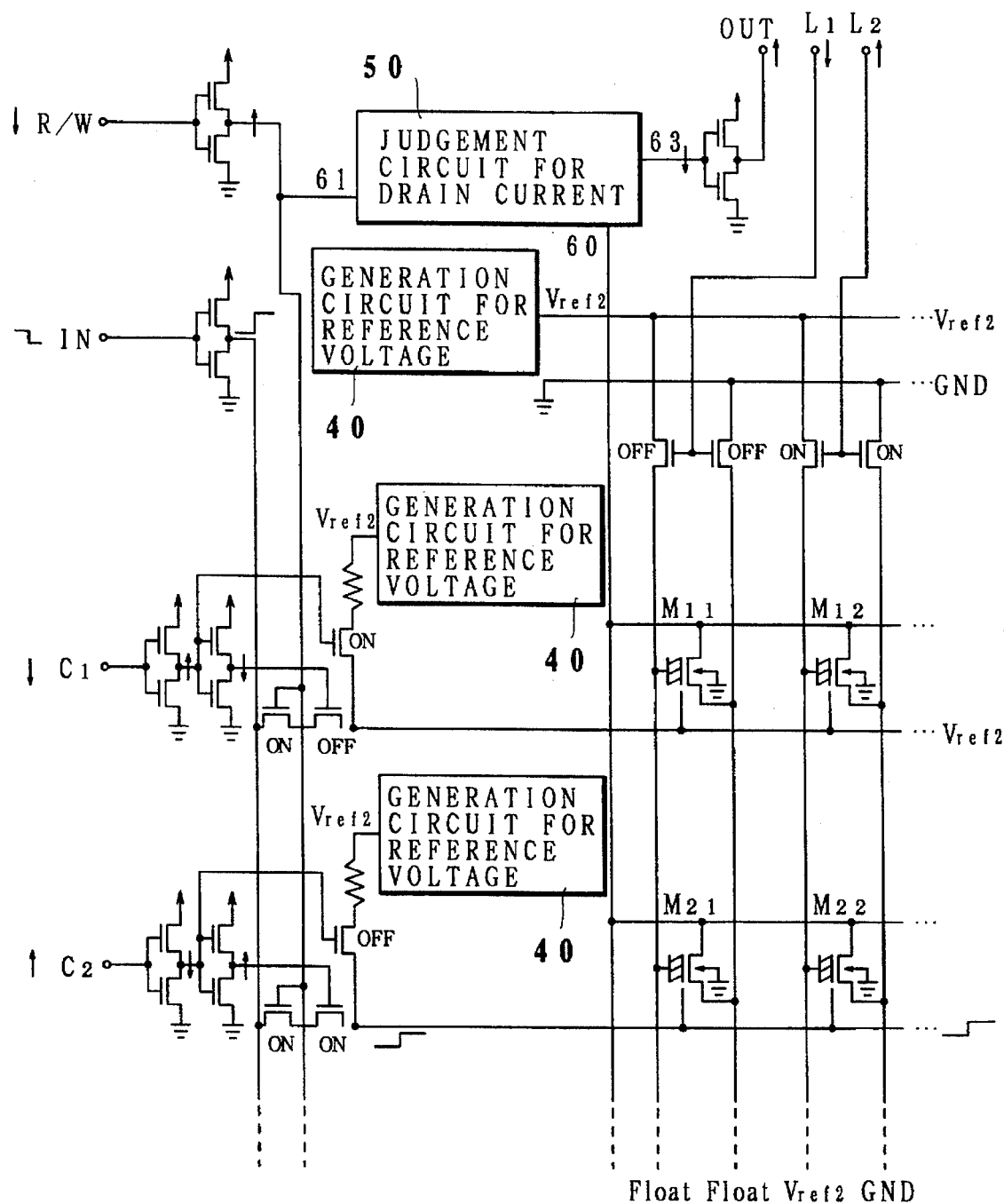
FIG. 11 is a view illustrating a diagram of the applied voltage at each part when a memory utilizing the nonvolatile memory device as an embodiment of the present invention is under the data storing mode.

FIG. 11 shows a diagram of nonvolatile memory using the generating circuit 40 for reference voltage shown in FIG. 8 and the judgment circuit 50 for drain 20 current shown in FIG. 9. In the figure, only a 2×2 matrix is shown for convenience of explanation, actual memory device M being configured in a matrix of n×n. FIG. 14 shows a table of applied voltages for each terminal when in the write operation mode. Here, memory device M$_{22}$ is the selected memory device. In the writing operation, a terminal R/W is made to the "L" state. Thus, the operating input terminal 61 of the judgment circuit 50 for the drain current is turned to the "H" state, and the judgment circuit 50 does not carry out the read out operation (the read out output terminal 63 is fixed to as L state).

Desired data for storing is provided from a terminal IN as "H" level or "L" level. At that time, the "H" state is provided to a terminal C2 and a terminal L2 for selecting the memory device M$_{22}$ as a selected memory 10 device. In this operation, applied voltages for each line are the same voltages as shown in FIG. 6.

Figure 12:
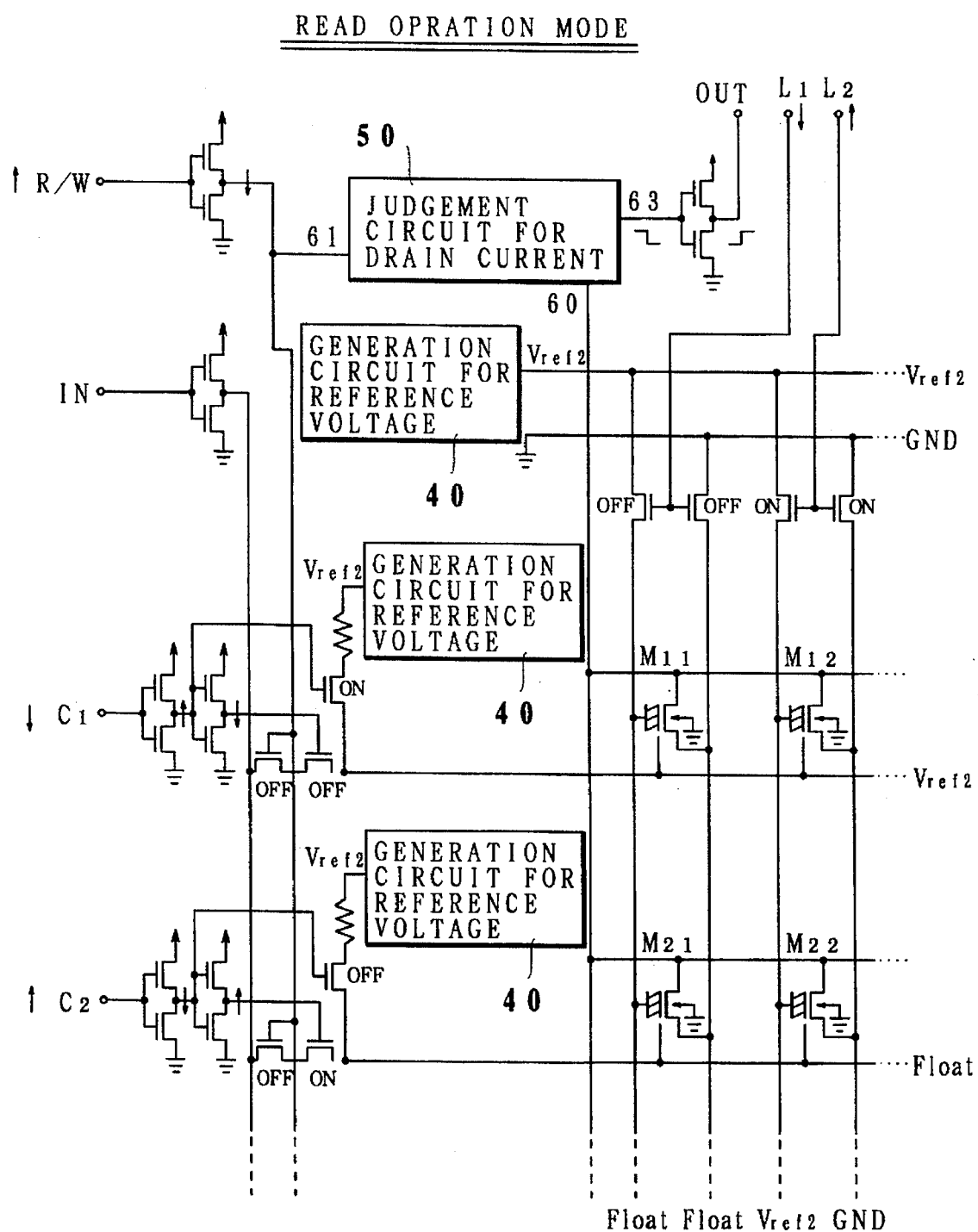
FIG. 12 is a view illustrating a diagram of the applied voltage at each part when a memory utilizing the nonvolatile memory device as an embodiment of the present invention is under the data reading mode.

FIG. 12 is a diagram illustrating the nonvolatile memory shown in FIG. 11 performing the read out operation. In this operation, exactly the same operation is carried out to select the memory device M$_{22}$ as a selected memory device. On the contrary, the terminal R/W is made to the "H" state when reading out data. Thus, the operating input terminal 61 of the drain current detection circuit 50 is turned to the "L" state, and the stored data is read out by the current detection circuit 50. That is, the read-out data is detected based on a current flow through the drain line, then the result of the detection is outputted from the terminal OUT. In this operation, applied voltages for each line, are the same voltages as shown in FIG. 6.

Figure 13:
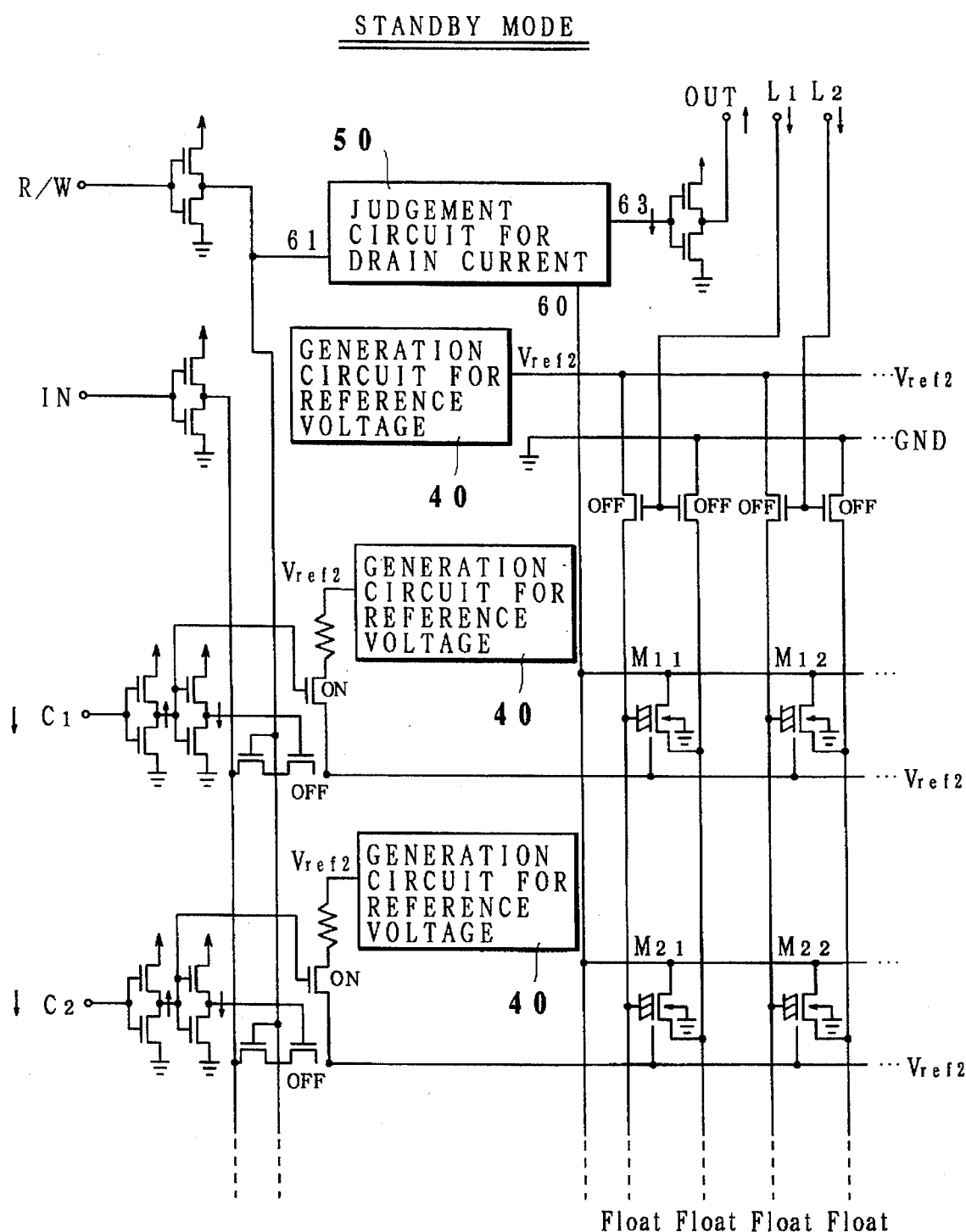
FIG. 13 is a view illustrating a diagram of the applied voltage at each part when a memory utilizing the nonvolatile memory device as an embodiment of the present invention is under the stand-by mode.

Furthermore, FIG. 13 is a diagram illustrating the non-volatile memory shown in FIG. 11 in a stand-by state. In this embodiment, the nonvolatile memory in a stand-by state when any of the memory devices is not selected as a selected memory device (when all the terminal C and the terminal L are under "L" state). Also, applied voltages for each line are, the same voltages as shown in FIG. 6.

Figure 15:
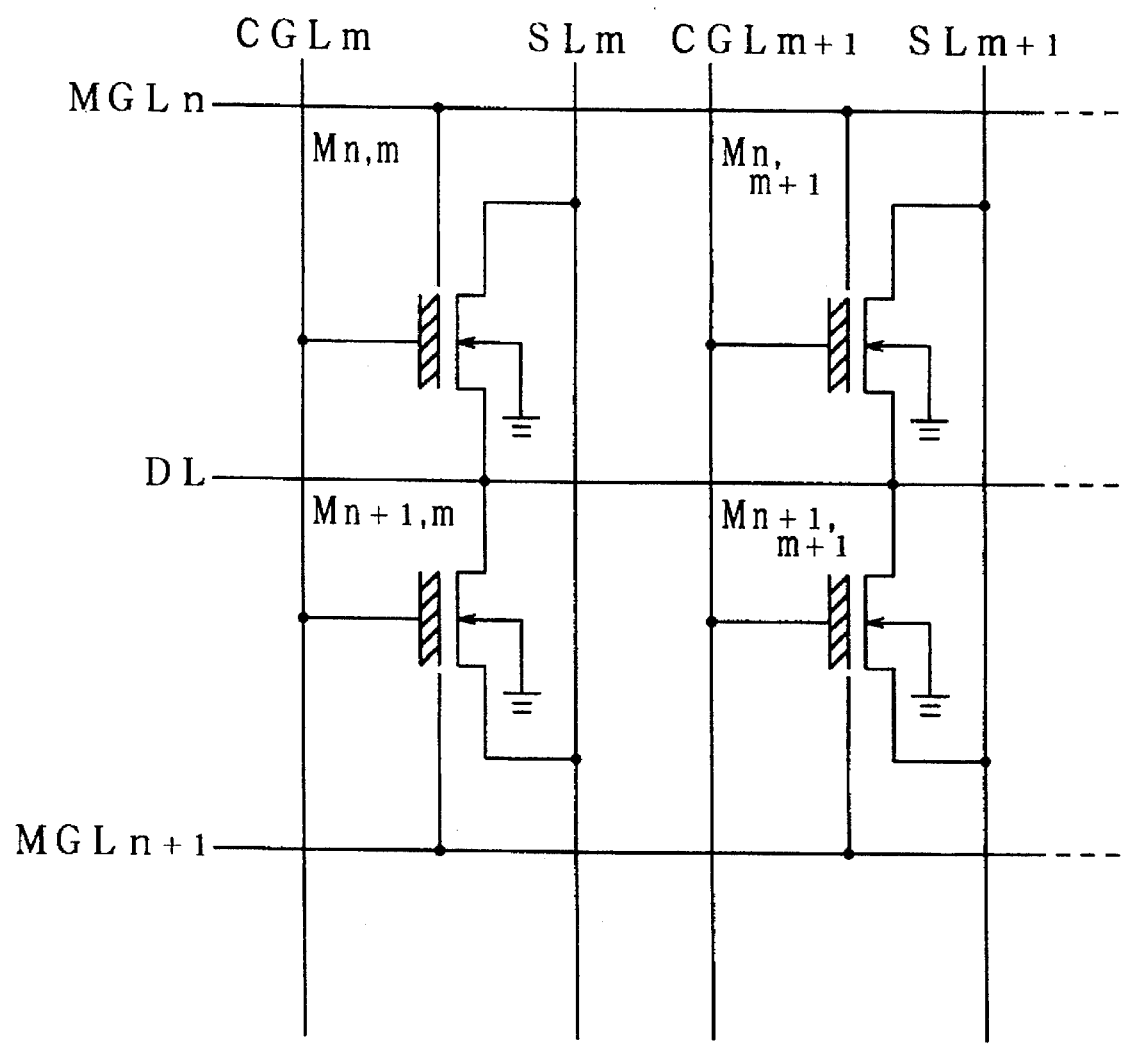
FIG. 15 is a view illustrating another embodiment to form a matrix structure of the memory device.

It is possible to employ a cell structure called a pair-cell structure as shown in FIG. 15 instead of 10 the structure shown in FIG. 5.

In the above described embodiment, the ferroelectric layer 32 is polarized either in the first polarization state or in the second polarization state by changing the direction of the voltage applied between the 15 control gate CG and the memory gate MG. However, data storing and read out can be carried out when the memory gate MG is under a floating state as described as follows.

In this case, the nonvolatile memory device M is formed so as to have equivalent potential (2.5 V in this example) when negative voltage is applied to the memory gate and positive voltage is applied to the substrate B by adjusting the density of impurities to the channel region when forming the device M.

When writing data to the device M, a source S, a drain D and a substrate (channel) B are connected to the ground. During this condition, desired data for writing, either "H" level or "L" level (SV or OV), is applied to the control gate CG.

The potential 2.5 V (threshold voltage V$_{TH}$) is charged during the production process of the device M influences the ferroelectric layer 32. Therefore, when 5 V is applied to the control gate CG, substantially 2.5 V (such as positive voltage is applied to the control gate and negative voltage is applied to the memory gate) is applied to the ferroelectric layer 32. Therefore, the ferroelectric layer 32 is polarized to the second polarization state.

On the other hand, the potential 2.5 V (threshold voltage V$_{TH}$) charged during the production process of the device M influences the ferroelectric layer 32. Therefore when 0 V is applied to the control gate CG, substantially 2.5 V (such as negative voltage is applied to the control gate and positive voltage is applied to the memory gate) is applied to the ferroelectric layer 32. Therefore, the ferroelectric layer 32 is polarized to the first polarization state.

It is possible to store data to the device M with floating the memory gate MG as described above.

When reading out the stored data, a voltage 2.5 V substantially equivalent to the threshold voltage $V_{TH}$ is applied to the control gate CG as a reference voltage $V_{ref}$ and then detecting whether the drain current flows or not. That is, the stored data can be read out under nondestructive conditions by detecting whether a drain current flows to either point X or point Y in FIG. 2.

In this embodiment, data storing or read out can be carried out with floating the memory gate MG. Thus, a line for controlling the memory gate MG is not necessary and the configuration of the circuit can be simplified.

The nonvolatile memory device of the present invention stores data under nondestructive conditions by changing the direction of polarization of the ferroelectric layer. Further, the nonvolatile memory device comprises the memory gate as the lower conducting layer, and a desired voltage can be provided to both sides of the ferroelectric layer accurately.

The reference voltage generating circuit 40 in the present invention uses a device which has the same configuration as the nonvolatile memory device and is made from the same wafer, in the same process and at the same time as the nonvolatile memory device. Therefore, if the electric characteristics of the nonvolatile memory device are changed during the process of production or operation, the electric characteristics of the device in the 25 reference voltage generating circuit follow those of the nonvolatile memory device. Thus, appropriate reference voltages can always be generated.

Additionally, the reference voltage generating circuit 40 in the present invention uses a device which has the same configuration as the nonvolatile memory device and is made from the same wafer, in the same process and at the same time as the nonvolatile memory device to generate a current. Thus, if the electric characteristics of the nonvolatile memory device are changed during the process of production or operation, the electric characteristics of the device for generating a current in the reference voltage generating circuit follow those of the nonvolatile memory device. Therefore, appropriate current is always generated, and as a result of that, appropriate reference voltages can always be generated.

Further, the drain current detection circuit 50 in the present invention uses a device which has the same configuration as the nonvolatile memory device and is made from the same wafer, in the same process and at the same time as the nonvolatile memory device, to detect a drain current. Thus, if the electric characteristics of the nonvolatile memory device are changed during the process of production or operation, the electric characteristics of the device for detecting the drain current in the detection circuit follow those of the nonvolatile memory device. As a result, appropriate detection can always be carried out.

Still further, the drain current detection circuit 50 in the present invention uses a device which has the same configuration as the nonvolatile memory device and is made from the same wafer, in the same process and at the same time as the nonvolatile memory device, to detect a drain current. Thus, if the electric characteristics of the nonvolatile memory device are changed during the process of production or operation, the electric characteristics of the device for generating a current in the drain current detection circuit follow those of the nonvolatile memory device. Therefore, appropriate current can always be generated, and as a result of that, correct detection can always be carried out. Thus, it is possible to carry out a detection of memory (detection of drain current) not dependent on absolute electric characteristics of the device by detecting a variation of remnant polarization itself correctly.

The current source in the present invention uses a device which has the same configuration as the nonvolatile memory device and is made from the same wafer, in the same process and at the same time as the nonvolatile memory device. Thus, if the electric characteristics of the nonvolatile memory device are changed during the process of production or operation, the electric characteristics of the device for generating a current in the circuit follow those of the nonvolatile memory devices. Not only that, in the circuit, the establishes. maximum drain current capable of bringing out a maximum drive capacity of the memory device is utilized as a standard. Thus, the memory device can be operated at maximum capacity (maximum operation, speed).

The peripheral circuit in the present invention uses a device which has the same configuration as the nonvolatile memory device and is made from the same wafer, in the same process and at the same time as the nonvolatile memory device. Thus, if the electric characteristics of the nonvolatile memory device are changed during the process of production or operation, the electric characteristics of the device in the peripheral circuit follow those of the nonvolatile memory device. Consequently, the peripheral circuit always maintain appropriate electric characteristics.

The method of storing data in the present invention provides that a certain voltage is applied between the memory gate and the control gate of the ferroelectric memory device. Therefore, it is possible to carry out a polarization reverse of the ferroelectric in high efficiency by applying the correct desired voltage to the ferroelectric layer.

Also, the method of reading data in the present invention provides that stored data is read out by detecting the drain current when the memory gate is made under a floating state and the reference voltage is applied to the control gate. Thus, the stored data can be read out under nondestructive conditions.

Further, the method of storing data in the present invention provides that the ferroelectric layer is polarized by connecting the drain and the source region to ground and then applying a voltage either H level or L level state to the control gate. Thus, it is not necessary to control the memory gate. Consequently, configuration of the circuits can be simplified.

Still further, the method for reading a data in the present invention provides that stored data is read out by detecting the drain current with applying the threshold voltage to the control gate. Thus, the stored data can be read out under nondestructive conditions. Moreover, it is not necessary to control the memory gate. Consequently, configuration of the circuits can be simplified.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A nonvolatile memory device comprising:
   a) a source region of a first conductive type and a drain region of a first conductive type,
   b) a channel region of a second conductive type formed between the source and the drain regions,
   c) a memory gate formed on the channel region and insulated from the channel region, a predetermined voltage being applied to said memory gate in at least a write operation, d) a ferroelectric layer formed on the memory gate, e) a control gate formed on the ferroelectric layer, and f) a judgment circuit for detection of a drain current, connected to the drain region.

2. The nonvolatile memory device of claim 1, comprising a generating circuit for a reference voltage wherein said reference voltage corresponds to a drain current which has distinguishable values for the ferroelectric layer of the nonvolatile memory device being polarized in a first state, a second state and no polarized state, wherein said generating circuit comprises a device for reference voltage generation which has the same structure, is made from the same wafer and is made under the same process as said nonvolatile memory device, a memory gate and a control gate of the device for reference voltage generation being electrically connected, and wherein said reference voltage is obtained from the drain region of the device for reference voltage generation by applying reference current to the drain region.

3. The nonvolatile memory device of claim 2, said generating circuit for the reference voltage comprising a current source device which has the same structure, is made from the same wafer and is made under the same process as said nonvolatile memory device, having a memory gate and a control gate which are connected and said control gate being applied with power supply voltage to establish maximum drain current, and a current mirror circuit having an input side and an output side, wherein the drain region of the current source device is connected to the input side of the current mirror circuit, which circuit constant is selected for obtaining the reference current of 1/n of said established maximum drain current from the output side of the current mirror circuit, and said reference current being given to the drain region of the device for reference voltage generation.

4. The nonvolatile memory device of claim 1, the judgment circuit for drain current comprising a first device for current judgment which has the same structure, is made from the same wafer and is made under the same process as said nonvolatile memory device, the drain region, memory gate and control gate of said first device being connected and said drain region of said first device being impressed with a first current smaller than the established maximum current, and a second device for current judgment which has the same structure, is made from the same wafer and is made under the same process as said nonvolatile memory device, the memory gate and control gate of said second device being connected, said control gate of the second device being connected to said control gate of the first device, and said drain region of said second device being applied with a second current smaller than said first current, wherein the drain region of said nonvolatile memory device to be judged is connected to said control gate of the second device so that judgment for the drain current is carried out by detecting whether the second device turns on or off.

5. The nonvolatile memory device of claim 4, the judgment circuit for drain current further comprising a current source device which has the same structure, is made from the same wafer and is made under the same process as said nonvolatile memory device, a memory gate and a control gate being connected, and said control gate being applied with power supply voltage to establish maximum drain current, and a current mirror circuit having an input side and an output side, wherein the drain region of the current source device is connected to the input side of the current mirror circuit which circuit constant is selected for obtaining the first current of ½ of said established maximum drain current and the second current of ¼ of said established maximum drain current from the output sides of the current mirror circuit.

6. The nonvolatile memory device of claim 1, further comprising a current source device which has the same structure, is made from the same wafer and is made under the same process as said nonvolatile memory device, a memory gate and a control gate being connected, and said control gate being applied with power supply voltage to establish maximum drain current, and a current mirror circuit having an input side and an output side, wherein the drain region of the current source device is connected to the input side of the current mirror circuit which circuit constant is selected for obtaining a current of 1/n of said established maximum drain current from the output side of the current mirror circuit.

7. The nonvolatile memory device of claim 1, further comprising a peripheral circuit, said peripheral circuit comprising a current source, a generating circuit and a judgment circuit for a drain current:

wherein said current source comprises, a1) a current source device which has the same structure, is made from the same wafer and is made under the same process as said nonvolatile memory device, a memory gate and a control gate being connected, and said control gate being applied with power supply voltage to establish a maximum drain current, and a2) a current mirror circuit having an input side and an output side, a3) wherein the drain region of the current source device is connected to the input side of the current mirror circuit which circuit constant is selected for obtaining the first current of ½ of said established maximum drain current and the second current of ¼ of said established maximum drain current from the output side of the current mirror circuit;

wherein said generating circuit for a reference voltage comprises b1) a device for reference voltage generation which has the same structure, is made from the same wafer and is made under the same process as said nonvolatile memory device, a memory gate and a control gate of the device for reference voltage generation being electrically connected, and b2) wherein said reference voltage is obtained from the drain region of the device for reference voltage generation by applying said reference current of the current source to the drain region of the device for reference voltage; and wherein said judgment circuit for the drain current comprises c1) a first device for current judgment which has the same structure, is made from the same wafer and is made under the same process as said nonvolatile memory device, the drain region, memory gate and control gate of said first device being connected and said drain region of said first device being impressed with a first current of ½ of the established maximum current from the current source, and c2) a second device for current judgment which has the same structure, is made from the same wafer and is made under the same process as said nonvolatile memory device, the memory gate and control gate of said second device being connected, said control gate of the second device being connected to said control gate of the first device, and said drain region of the second device being applied with a second current of ¼ of the established maximum current from the current source, c3) wherein the drain region of said nonvolatile memory device to be judged is connected to said control gate of the second device so that judgment for the drain current is carried out by detecting whether the second device turns on or off.

8. A method for writing data into a nonvolatile memory device, said nonvolatile memory device comprising a source region of a first conductive type and a drain region of a first conductive type, a channel region of a second conductive type formed between the source and the drain regions, a memory gate formed on the channel region and insulated from the channel region, a predetermined voltage being applied to said memory gate in at least a write operation, a ferroelectric layer formed on the memory gate, a control gate formed on the ferroelectric layer, and a judgment circuit for a drain current connected to the drain region of the nonvolatile memory device, said method for writing data, said method comprising the steps of:

applying to the control gate an intermediate voltage higher than zero and lower than a voltage corresponding to an established maximum drain current, polarizing the ferroelectric layer of the nonvolatile memory device into either a second state by applying higher voltage than the intermediate voltage or into a first state by applying lower voltage than the intermediate voltage.

9. A method for storing data according to claim 8:

wherein the intermediate voltage is a voltage corresponding to a current of approximately half of the established maximum drain current.

10. A method for reading out stored data from a nonvolatile memory device, said nonvolatile memory device comprising a source region of a first conductive type and a drain region of a first conductive type, a channel region of a second conductive type formed between the source and the drain regions, a memory gate formed on the channel region and insulated from the channel region, a predetermined voltage being applied to said memory gate in at least a write operation, a ferroelectric layer formed on the memory gate, a control gate formed on the ferroelectric layer, and a judgment circuit for a drain current connected to the drain region of the nonvolatile memory device, said method for writing data, said method comprising the steps of:

applying a reference voltage to the control gate of said nonvolatile memory device, thereby a first drain current of said nonvolatile memory flowing when the ferroelectric layer of said nonvolatile memory device is polarized with a first state, a second drain current of said nonvolatile memory flowing when the ferroelectric layer of said nonvolatile memory device is polarized with a second state and a reference current having an intermediate value between the first drain current and the second drain current flowing when the ferroelectric layer of said nonvolatile memory device is not polarized, floating the memory gate of said nonvolatile memory device, and judging whether the drain current is larger or smaller than the reference current, thereby reading out the recorded data with destruction.

11. A method for reading out data according to claim 10, wherein said reference voltage is a voltage corresponding to a current approximately half of the established maximum drain current.

12. A method for writing to and reading from a nonvolatile memory device, said nonvolatile memory device comprising a source region of a first conductive type and a drain region of a first conductive type, a channel region of a second conductive type formed between the source and the drain regions, a memory gate formed on the channel region and insulated from the channel region, a predetermined voltage being applied to said memory gate in at least a operation, a ferroelectric layer formed on the memory gate, a control gate formed on the ferroelectric layer, and a judgment circuit for a drain current, connected to the drain region nonvolatile memory device, said method comprising a writing operation and a reading operation: wherein said writing operation comprises the steps of;

applying to the control gate an intermediate voltage higher than zero and lower than a voltage corresponding to an established maximum drain current, and polarizing the ferroelectric layer of the nonvolatile memory device into either a second state by applying a higher voltage than the intermediate voltage or into a first state by applying a lower voltage than the intermediate voltage; and said reading operation comprises the steps of:

applying a reference voltage to the control gate of said nonvolatile memory device, thereby the first drain current of said nonvolatile memory flowing when the ferroelectric layer of said nonvolatile memory device is polarized with a first state, a second drain current of said nonvolatile memory flowing when the ferroelectric layer of said nonvolatile memory device is polarized with a second state and a reference current having an intermediate value between, the first drain current and the second drain current flowing when the ferroelectric layer of said nonvolatile memory device is not polarized, floating the memory gate of said nonvolatile memory device, and judging whether the drain current is larger or smaller than the reference current, thereby reading out the recorded data without destruction.

13. A method for storing data according to claim 12:

wherein the value of the intermediate voltage is the same as that of the reference voltage.

14. A method for reading out data according to claim 13, wherein both of said reference voltage and said intermediate voltage are voltages corresponding to a current approximately half of an established maximum drain current.

15. A method for writing data into a nonvolatile memory device, said nonvolatile memory device comprising a source region of a first conductive type and a drain region of a first conductive type, a channel region of a second conductive type formed between the source and the drain regions, a memory gate formed on the channel region and insulated from the channel region, a predetermined voltage being applied to said memory gate in at least a write operation, a ferroelectric layer formed on the memory gate, a control gate formed on the ferroelectric layer, and a judgment circuit for a drain current, connected to the drain region of the nonvolatile memory device, said method for writing data, said method comprising the steps of:

> floating the memory gate of said nonvolatile memory device,
>
> connecting the channel region of said nonvolatile memory device to ground,
>
> polarizing the ferroelectric layer of the nonvolatile memory device into either a first state by applying a higher voltage than a threshold voltage of the nonvolatile memory device, or a second state by applying a lower voltage than said threshold voltage.

16. A method for reading out data from a nonvolatile memory device, said nonvolatile memory device comprising a source region of a first conductive type and a drain region of a first conductive type, a channel region of a second conductive type formed between the source and the drain regions, a memory gate formed on the channel region and insulated from the channel region, a predetermined voltage being applied to said memory gate in at least a write operation, a ferroelectric layer formed on the memory gate, a control gate formed on the ferroelectric layer, and a judgment circuit for a drain current, connected to the drain region of the nonvolatile memory device, said method for writing data, said method comprising the steps of:

> applying a reference voltage to the memory gate of said nonvolatile memory device, said reference voltage being substantially the same as a threshold voltage of said nonvolatile memory device,
>
> floating the memory gate of said nonvolatile memory device,
>
> judging whether the drain current is larger or smaller than the reference current, thereby reading out the recorded data with out destruction.

17. A method for reading out data according to claim 16, wherein said threshold voltage is established to a voltage corresponding to a current approximately half of an established maximum drain current.

18. A method for writing to and reading from a nonvolatile memory device, said nonvolatile memory device comprising a source region of a first conductive type and a drain region of a first conductive type, a channel region of a second conductive type formed between the source and the drain regions, a memory gate formed on the channel region and insulated from the channel region, a predetermined voltage being applied to said memory gate in at least a write operation, a ferroelectric layer formed on the memory gate, a control gate formed on the ferroelectric layer, and a judgment circuit for a drain current, connected to the drain region of the nonvolatile memory device, said method for writing data comprising a writing operation and a reading operation: wherein said writing operation comprises the steps of:

> floating the memory gate of said nonvolatile memory device,
>
> connecting the channel region of said nonvolatile memory device to ground,
>
> polarizing the ferroelectric layer of the nonvolatile memory device into either a first state by applying higher voltage than a threshold voltage of the nonvolatile memory device, or a second state by applying lower voltage than said threshold voltage; and said reading operation comprises the steps of:

> applying a reference voltage to the memory gate of said nonvolatile memory device, said reference voltage being substantially the same as the threshold voltage of said nonvolatile memory device,
>
> floating the memory gate of said nonvolatile memory device,
>
> judging whether the drain current is larger or smaller than the reference current, thereby reading out the recorded data without destruction.

19. The method for writing to and reading from the nonvolative memory device according to claim 18, wherein said threshold voltage is established as a voltage corresponding to a current approximately half of the established maximum drain current.

* * * * *